United States Patent
Chiu et al.

(10) Patent No.: US 12,033,923 B2
(45) Date of Patent: Jul. 9, 2024

(54) SEMICONDUCTOR PACKAGE STRUCTURE HAVING A LEAD FRAME AND A PASSIVE COMPONENT

(71) Applicant: Advanced Semiconductor Engineering, Inc., Kaohsiung (TW)

(72) Inventors: Chi-Tsung Chiu, Kaohsiung (TW); Hui-Ying Hsieh, Kaohsiung (TW); Chun Hao Chiu, Kaohsiung (TW); Chiuan-You Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 78 days.

(21) Appl. No.: 17/023,267

(22) Filed: Sep. 16, 2020

(65) Prior Publication Data

US 2022/0084914 A1 Mar. 17, 2022

(51) Int. Cl.
H01L 23/495 (2006.01)

(52) U.S. Cl.
CPC .. *H01L 23/49558* (2013.01); *H01L 23/49503* (2013.01); *H01L 23/49527* (2013.01); *H01L 23/49537* (2013.01); *H01L 23/49541* (2013.01); *H01L 23/49575* (2013.01); *H01L 23/49582* (2013.01); *H01L 2224/023* (2013.01); *H01L 2924/19011* (2013.01)

(58) Field of Classification Search
CPC ............ H01L 23/49503–49513; H01L 23/49541–49565; H01L 23/49575; H01L 23/49517–49531; H01L 2224/40265; H01L 2224/023–024; H01L 2924/19011; H01L 2924/19101
See application file for complete search history.

(56) References Cited

U.S. PATENT DOCUMENTS

| | | | | |
|---|---|---|---|---|
| 7,411,289 B1 * | 8/2008 | McLellan | ......... | H01L 23/49548 257/676 |
| 8,193,624 B1 * | 6/2012 | Sohn | ...................... | H01L 21/563 257/725 |
| 2009/0166825 A1 * | 7/2009 | Camacho | ............ | H01L 23/5389 257/676 |
| 2012/0319258 A1 * | 12/2012 | Lu | ........................ | H01L 21/4821 257/676 |
| 2019/0279937 A1 * | 9/2019 | Chiu | ...................... | H01L 21/486 |
| 2020/0105703 A1 * | 4/2020 | Kim | ........................ | H01L 23/13 |

* cited by examiner

*Primary Examiner* — Laura M Menz
*Assistant Examiner* — Candice Chan
(74) *Attorney, Agent, or Firm* — FOLEY & LARDNER LLP

(57) ABSTRACT

A semiconductor package structure is provided. The semiconductor package structure includes a lead frame and passive component. The lead frame includes a paddle and a plurality of leads. The lead frame includes a first surface and a second surface opposite to the first surface. The passive component includes an external connector. A pattern of the external connector is corresponding to a pattern of the plurality of leads of the lead frame.

16 Claims, 18 Drawing Sheets

SEMICONDUCTOR PACKAGE STRUCTURE HAVING A LEAD FRAME AND A PASSIVE COMPONENT

BACKGROUND

1. Field of the Disclosure

The present disclosure relates to a semiconductor package structure. Specifically, the present disclosure relates to a semiconductor package structure having a lead frame and a passive component.

2. Description of the Related Art

Conventionally embedded package structures include organic substrate base and lead frame base. Lead frame base is often adopted in high power chip embedded package due to its superior thermal dissipation character. In addition, one or more passive component may be mounted on the embedded package structure for more compact integration. A problem in an embedded package structure is the poor thermal dissipation between the passive component and the embedded die. The heat would accumulate between the passive component and the embedded die since an insulation layer surrounding the connections between the passive component and the embedded die has a poor thermal conductance. Therefore, a novel embedded package structure is needed especially for high power chip packages integrated with one or more passive components.

SUMMARY

In some embodiments, the semiconductor package structure includes a lead frame and passive component. The lead frame includes a paddle and a plurality of leads. The lead frame includes a first surface and a second surface opposite to the first surface. The passive component includes an external connector. A pattern of the external connector is corresponding to a pattern of the plurality of leads of the lead frame.

In some embodiments, the semiconductor package structure includes a lead frame and passive component. The lead frame is composed of rolled annealed (RA) copper. The lead frame includes a first surface and a second surface opposite to the first surface. The passive component is disposed on the lead frame. The passive component includes an external connector including a solder layer. The RA copper is connected to the solder layer of the external connector.

In some embodiments, the semiconductor package structure includes a lead frame and passive component. The lead frame includes a paddle and a plurality of leads. The lead frame includes a first surface and a second surface opposite to the first surface. The passive component includes an external connector. The external connector is in direct contact with at least two of the plurality of leads.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
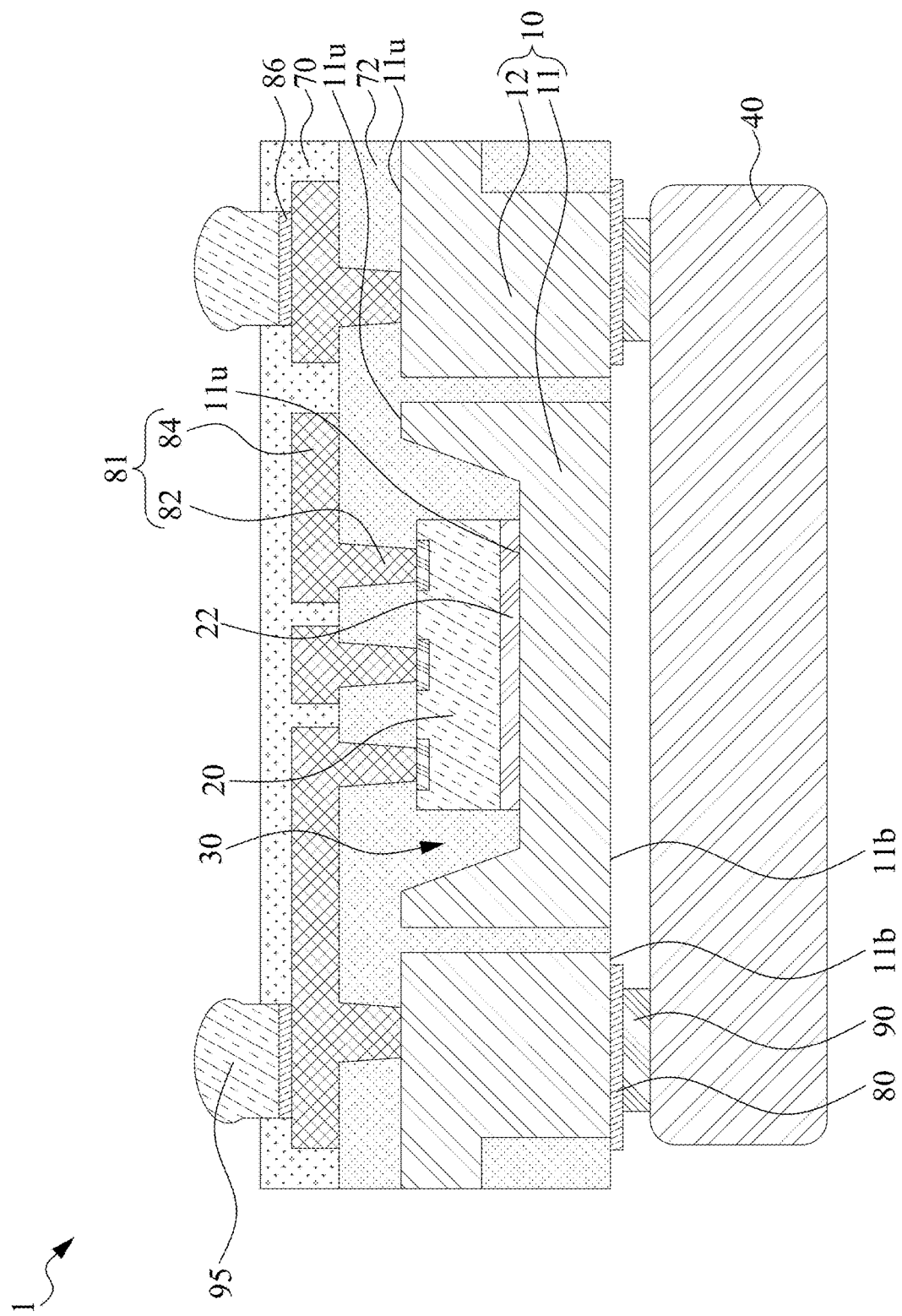
FIG. 1A illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a new semiconductor package structure. The semiconductor package structure includes a lead frame and passive component. The lead frame includes a paddle and a plurality of leads. The lead frame includes a first surface and a second surface opposite to the first surface. The passive component includes an external connector. A pattern of the external connector is corresponding to a pattern of the plurality of leads of the lead frame. The external connector of the passive component being in direct contact with at least two of the plurality of leads may improve the thermal dissipation between the passive component and a RDL structure, since a RDL structure is omitted between the passive component and the lead frame. The specific shape of the passive component may protect the lead frame since the lead frame is covered by the passive component. An insulation layer between the lead frame and the passive component may be omitted and the thermal dissipation may be improved. The manufacturing process may be simplified and the cost of the manufacturing process may be reduced. The shortened electrical path between the passive component and the lead frame may reduce the signal loss and improve the electrical performance.

FIG. 1A illustrates a cross-sectional view of a semiconductor package structure 1 according to some embodiments of the present disclosure. The semiconductor package structure 1 includes a lead frame 10, at least one semiconductor die (including, for example, a die 20) and a passive component 40 integrated in the semiconductor package structure 1.

The lead frame 10 includes a paddle 11 and a plurality of leads 12. The lead frame includes a first surface 11u and a second surface 11b opposite to the first surface 11u. The passive component 40 is disposed on the second surface 11b of the lead frame 10. The passive component 40 includes an external connector 90, for example, solder bumps composed of SnPb or lead-free solder, electrically connects the passive component 40 to the lead frame 10 and the die 20. In some embodiments, the passive component 40 includes an inductor. In some embodiments, no dielectric layer is disposed between the external connector 90 of the passive component 40 and the second surface 11b of the lead frame 10. In some embodiments, a surface finish layer 80 is disposed on the second surface 11b of the lead frame 10 and in direct contact with the external connector 90. In some embodiments, the surface finish layer 80 may include any suitable conductive material (such as, for example, nickel (Ni), palladium (Pd), gold (Au), silver (Ag), Cu, and combinations of metals). In some embodiments, the surface finish layer 80 is electroless nickel immersion gold (ENIG).

Figure 4A:
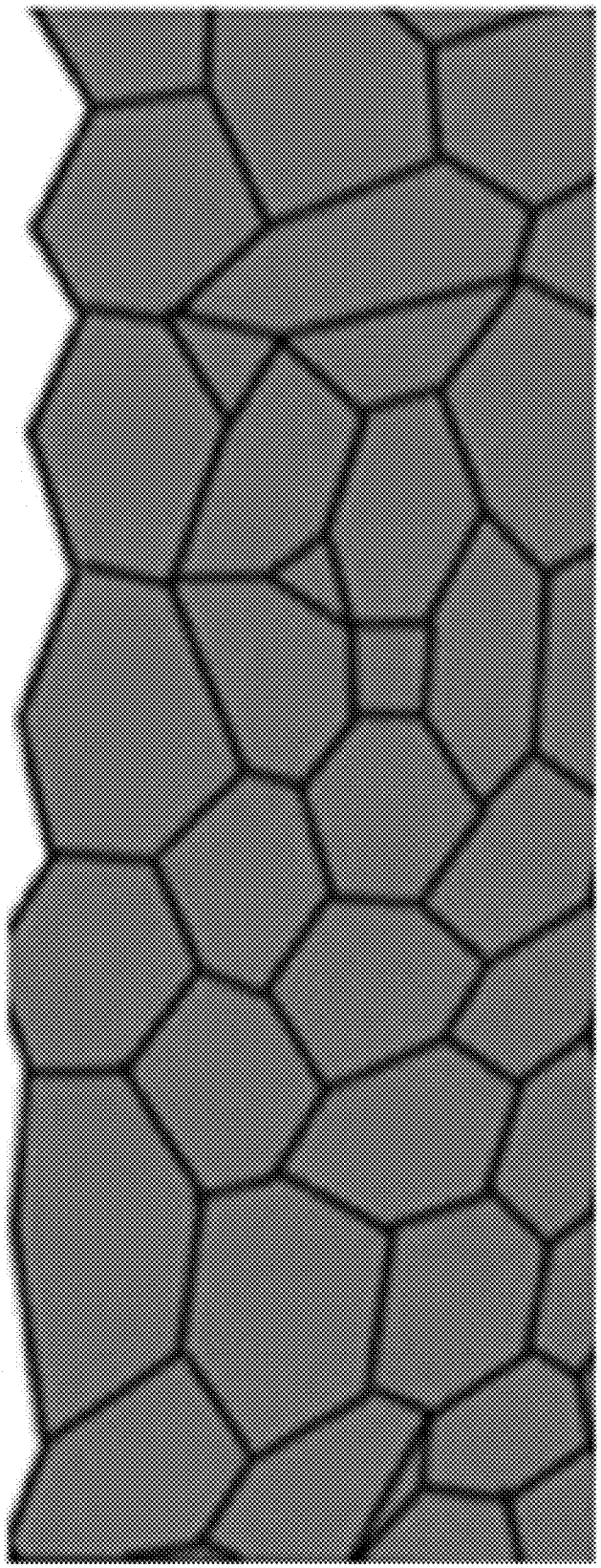
FIG. 4A and FIG. 4B illustrate the grains of a plating copper and a rolled annealed (RA) copper, respectively, according to some embodiments of the present disclosure.
Figure 4B:
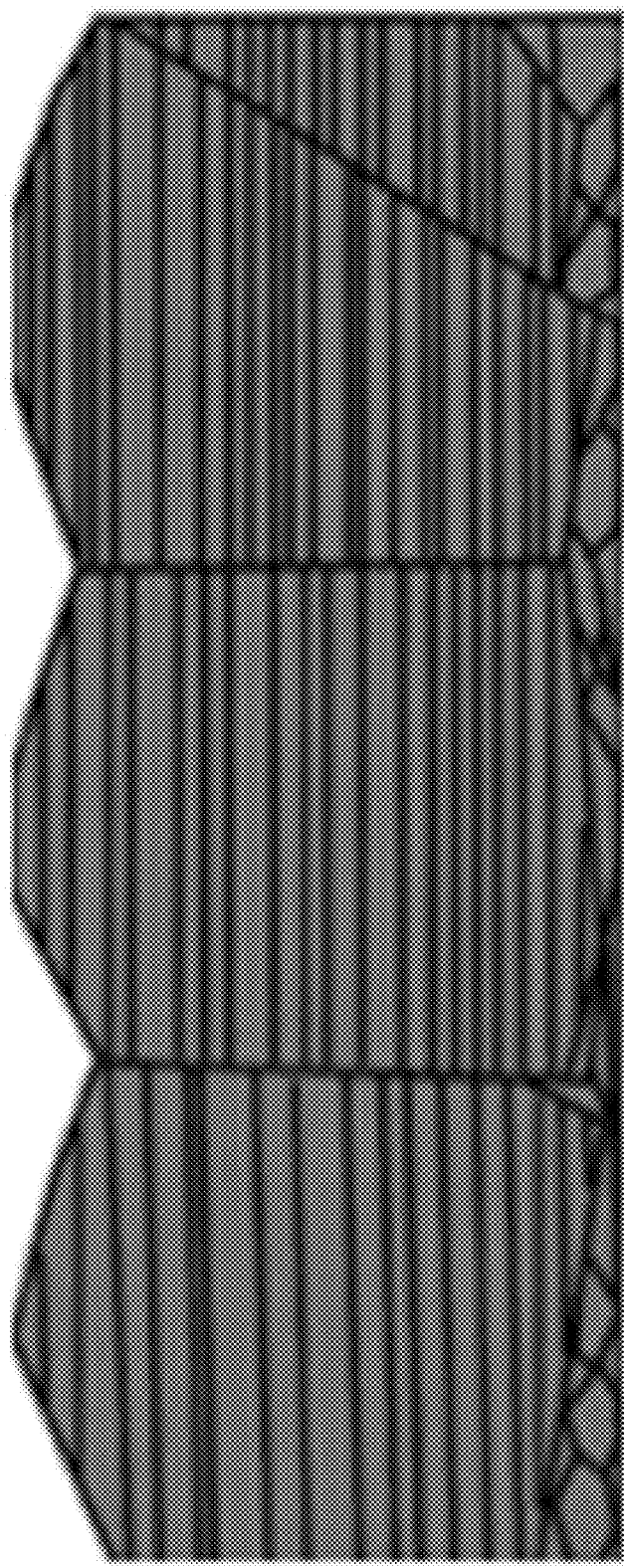

In some embodiments, the passive component 40 is electrically connected to at least two of the plurality of leads 12 through the external connector 90 and the surface finish layer 80. In some embodiments, similar to the paddle 11, the leads 12 of the lead frame 10 are composed of rolled annealed (RA) copper. The RA copper of the lead frame 10 is electrically connected to the external connector 90 (e.g., a solder layer or a solder material) through a surface finish layer 80. The surface finish layer 80 is in direct contact with the RA copper and the external connector 90. In some embodiments, the passive component 40 is disposed across the paddle 11 and aligned with at least two of the plurality of leads 12. With respect to the interface between the lead 12 and the finish layer 80, an interface defined by RA copper and ENIG can be observed. Different from plated copper, the RA copper possesses an elongated grain shape (or a preferred orientation) as illustrated in FIG. 4B. For example, the grains of RA copper can each define a principal elongation dimension as a result of the rolling and annealing operations, whereas the plated copper, as illustrated in FIG. 4A, may have grains without a defined elongated dimension. In some embodiments, the redistribution layer (RDL) 81 of the semiconductor package structure 1 is composed of plated copper. In other words, the passive component 40 is directly bonded to an RA copper surface instead of a plated copper surface.

From a top view perspective, and as will be discussed in FIG. 3A to FIG. 3C, a pattern of the external connector 90 corresponds to a pattern of the plurality of leads 12 of the lead frame 10. In some embodiments, the plurality of leads 12 are located at two sides of the paddle 11 from a top view perspective. In some embodiments, a geometrical shape of the pattern of the plurality of leads 12 matches a geometrical shape of the pattern of the external connector 90 of the passive component 40. In some embodiments, a dielectric layer 72 encapsulates the die 20 and the lead frame 10. In some embodiments, a material of the dielectric layer 72 may include a polypropylene (PP) resin; however, other suitable materials may be additionally or alternatively used.

The die 20 is disposed on the first surface 11u of the lead frame 10 through an adhesive layer 22. In some embodiments, the adhesive layer 22 may include adhesive material with high thermal conductivity so that the heat generated from the die 20 can be effectively dissipated through the lead frame 10. In some embodiments, the die 20 is disposed in a cavity 30 of the paddle 11 of the lead frame 10 and forms an embedded package. The die 20 is electrically connected to the first surface 11u of the lead frame 10 through a redistribution layer (RDL) 81. In some embodiments, the die 20 includes a powerchip.

In some embodiments, a plurality of conductive pads 86 are defined on the RDL 81. The conductive pads 86 are configured to connect with a printed circuit board (not shown) via conductive bumps 95. In some embodiments, the conductive pads 86 may include, for example, copper (Cu), or other metal, or a metal alloy, or other conductive material.

The RDL 81 includes conductive vias 82 and a conductive trace 84. The conductive vias 82 extends vertically from the conductive trace 84 to the die 20 and surrounded by the dielectric layer 72. In some embodiments, a material of the RDL 81 may include, for example, Cu, or other metal, or a metal alloy, or other conductive material.

A solder mask layer 70 is disposed on the dielectric layer 72. The solder mask layer 70 encapsulates or partially encapsulates the conductive trace 84 and conductive pad 86. The solder bump 95 is disposed on the conductive pad 86. The RDL 81 is electrically connected to the die 20 and electrically connected to the conductive bump 95 (e.g., a solder bump).

Figure 1B:
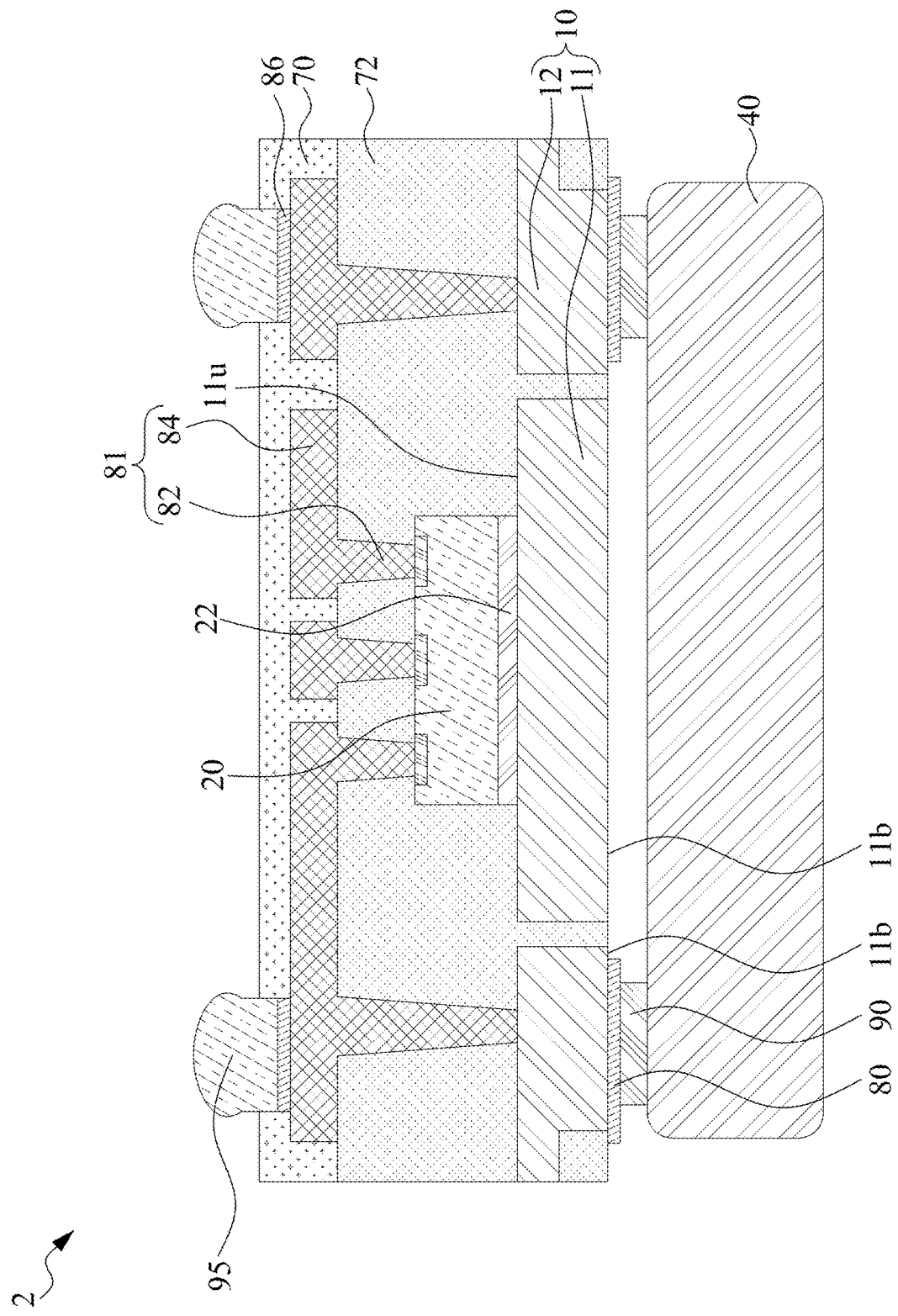
FIG. 1B illustrates a cross-sectional view of a semiconductor package structure according to some embodiments of the present disclosure.

FIG. 1B illustrates a cross-sectional view of a semiconductor package structure 2 according to some embodiments of the present disclosure. The semiconductor device package 2 is similar to the semiconductor device package 1 of FIG. 1A, except that the paddle 11 of the lead frame 10 does not include a cavity 30. Alternatively stated, the semiconductor package structure 2 is not an embedded package. Referring to FIG. 1B, the first surface 11u of the lead frame 10 is a planar surface. The RDL 81 is electrically connected to the die 20 and the first surface 11u of the lead frame 10. Identical numerical labels in FIG. 1B and FIG. 1A refer to substantially identical components or their equivalents and are not repeated here for brevity.

Figure 2A:
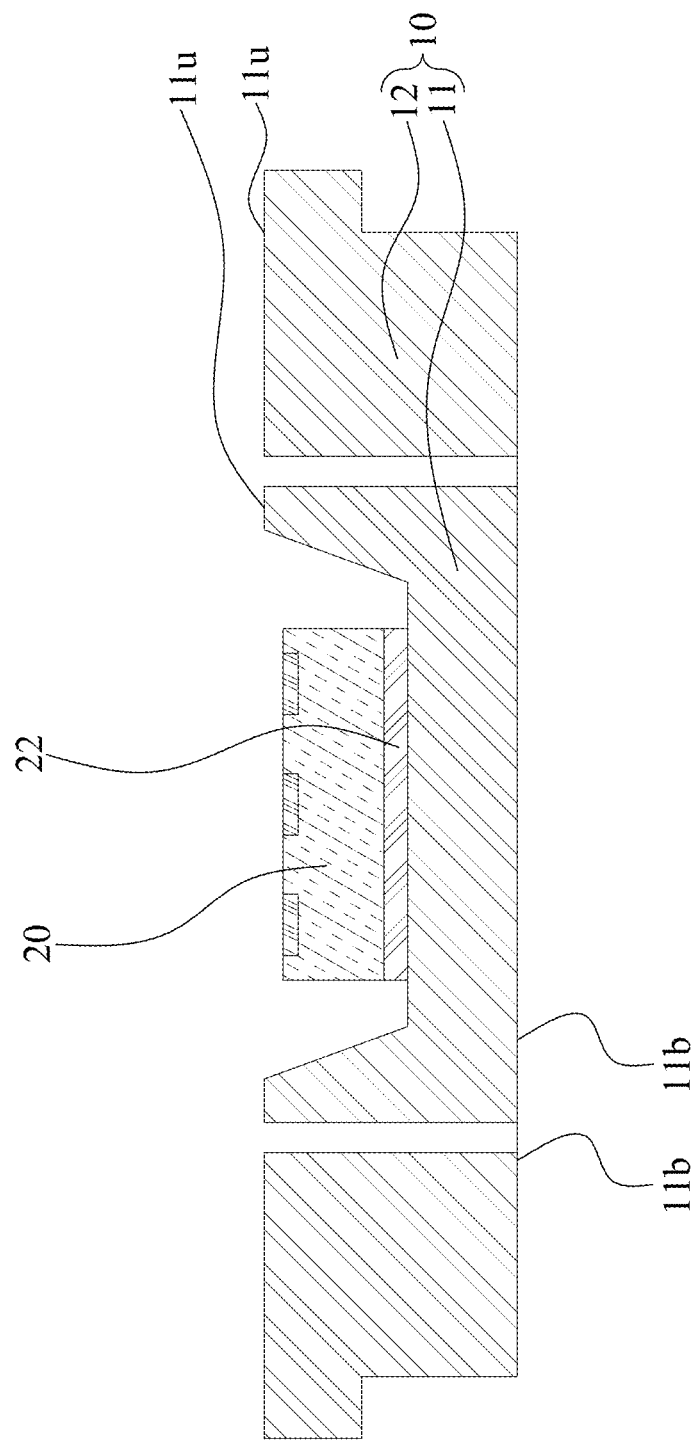
FIG. 2A, FIG. 2B, FIG. 2C, FIG. 2D, FIG. 2E, FIG. 2F, FIG. 2G, FIG. 2H, illustrate cross sections of a semiconductor package structure during various manufacturing operation according to a method of manufacturing the semiconductor package structure 1 depicted in FIG. 1A.

FIGS. 2A-2H illustrate cross sections of a semiconductor package structure during various manufacturing operation according to a method of manufacturing the semiconductor package structure 1 depicted in FIG. 1A. Referring to FIG. 2A, a lead frame 10 including a paddle 11 and a plurality of leads 12 is provided. In some embodiments, the lead frame 10 is composed of rolled annealed (RA) copper. A die 20 is disposed on the first surface 11u of the lead frame 10 through an adhesive layer 22. In some embodiments, the adhesive layer 22 may include adhesive materials with high thermal conductivity.

Figure 2B:
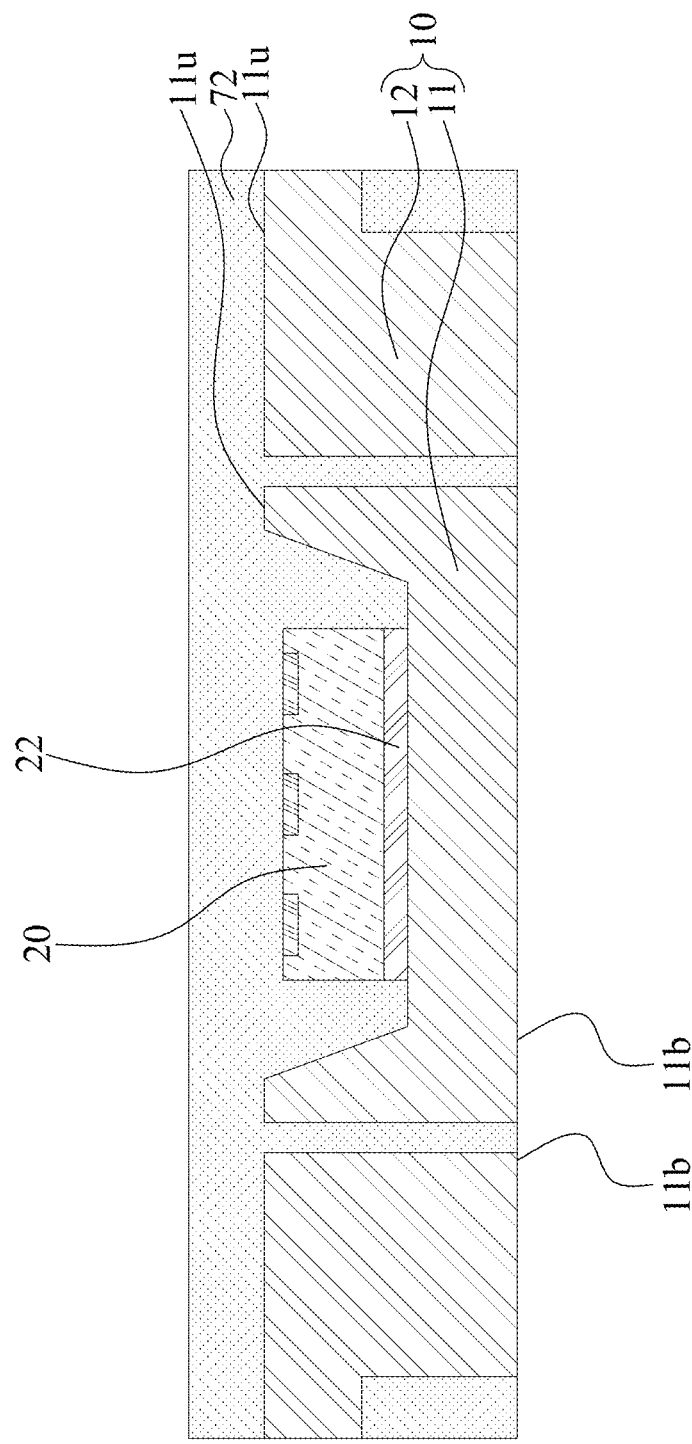

Referring to FIG. 2B, a dielectric layer 72 is laminated on the lead frame 10 to encapsulate the lead frame 10 and the die 20. In some embodiments, a material of the dielectric layer 72 may include a polypropylene (PP) resin for subsequent redistribution layer processing. However, other suitable materials may be additionally or alternatively used.

Figure 2C:
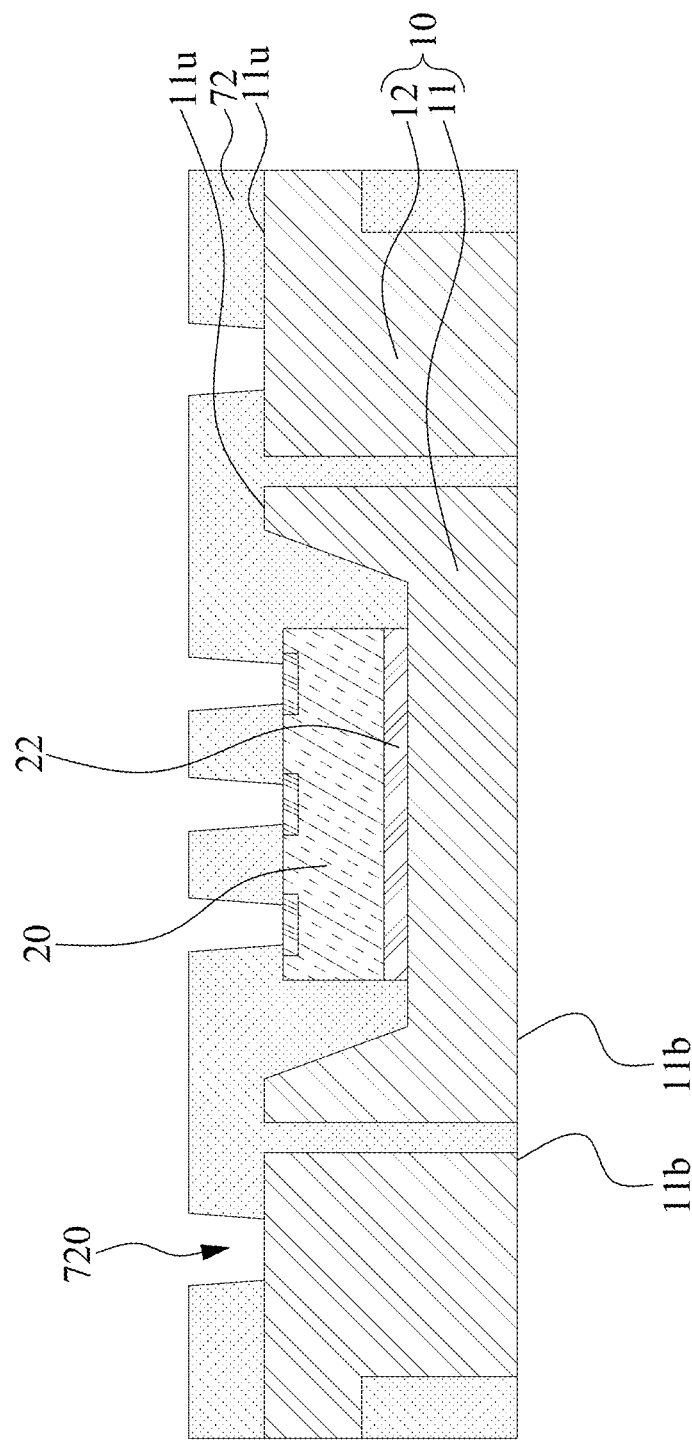

Referring to FIG. 2C, one or more openings 720 are formed in the dielectric layer 72 as one or more via trenches to be filled with conductive materials. In some embodiments, the openings 720 in the dielectric layer 72 are formed by a laser drilling techniques so that each of the openings may have a tapered profile with wider top and narrower bottom.

Figure 2D:
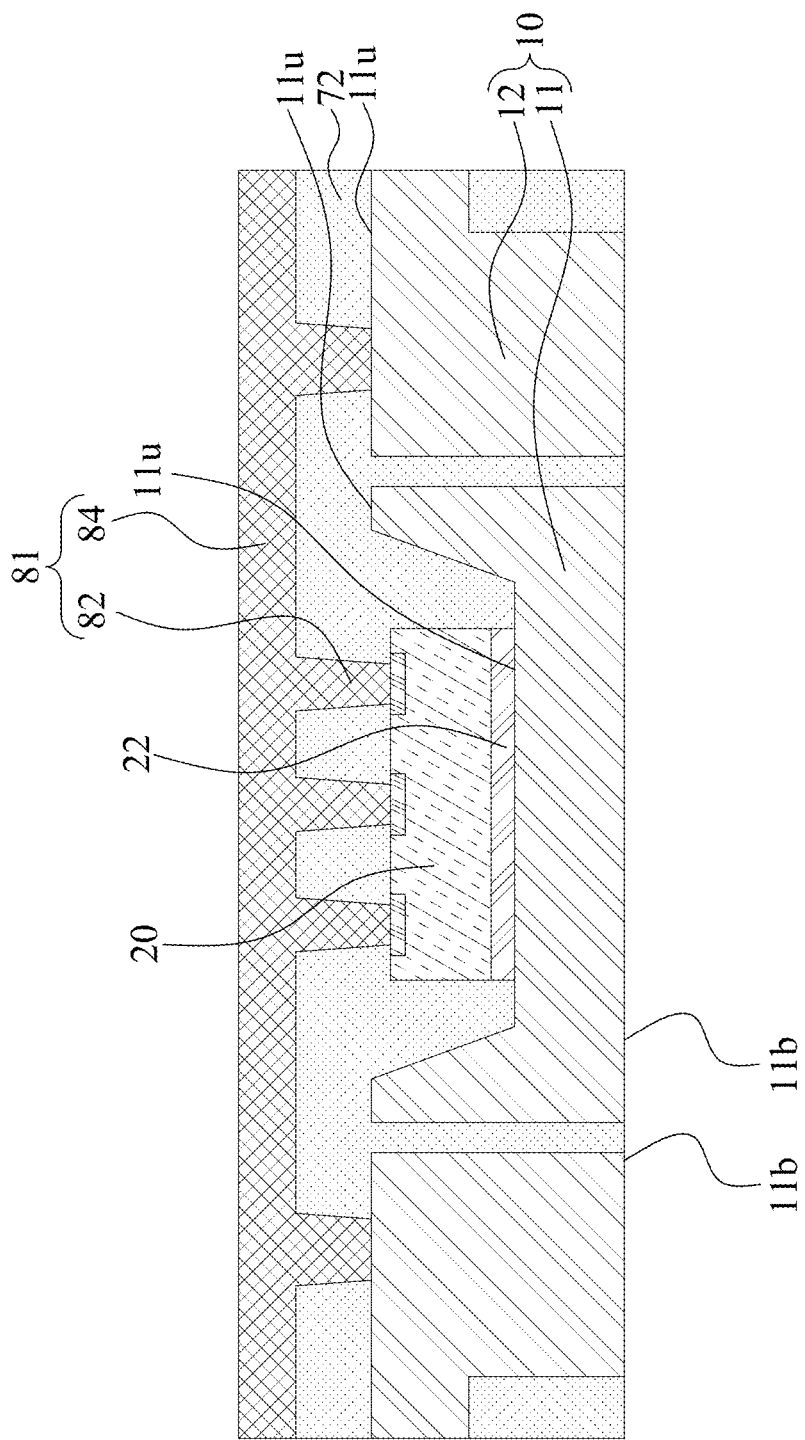
Figure 2E:
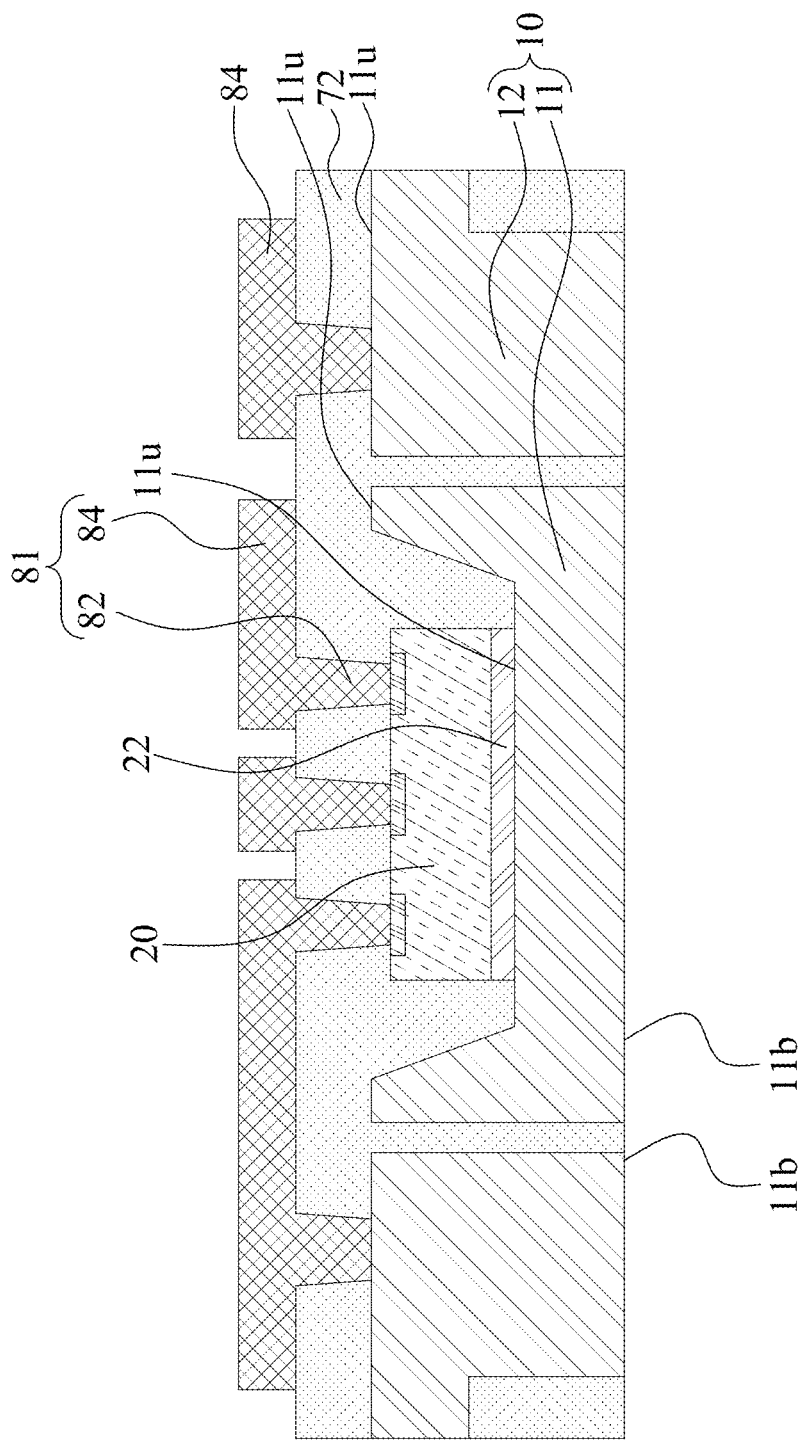

Referring to FIG. 2D, a plating operation is performed to fill the openings or the via trenches in the dielectric layer 72. Next, a conductive layer (e.g., a Cu layer) is formed on the top surface of the dielectric layer 72. In some embodiments, the conductive layer can be blanket plated over the top surface of the dielectric layer 72 and then followed by a patterning operation, as illustrated in FIG. 2E, so as to obtain the conductive vias 82 and conductive traces 84 as previously discussed in FIG. 1A and FIG. 1B.

Figure 2F:
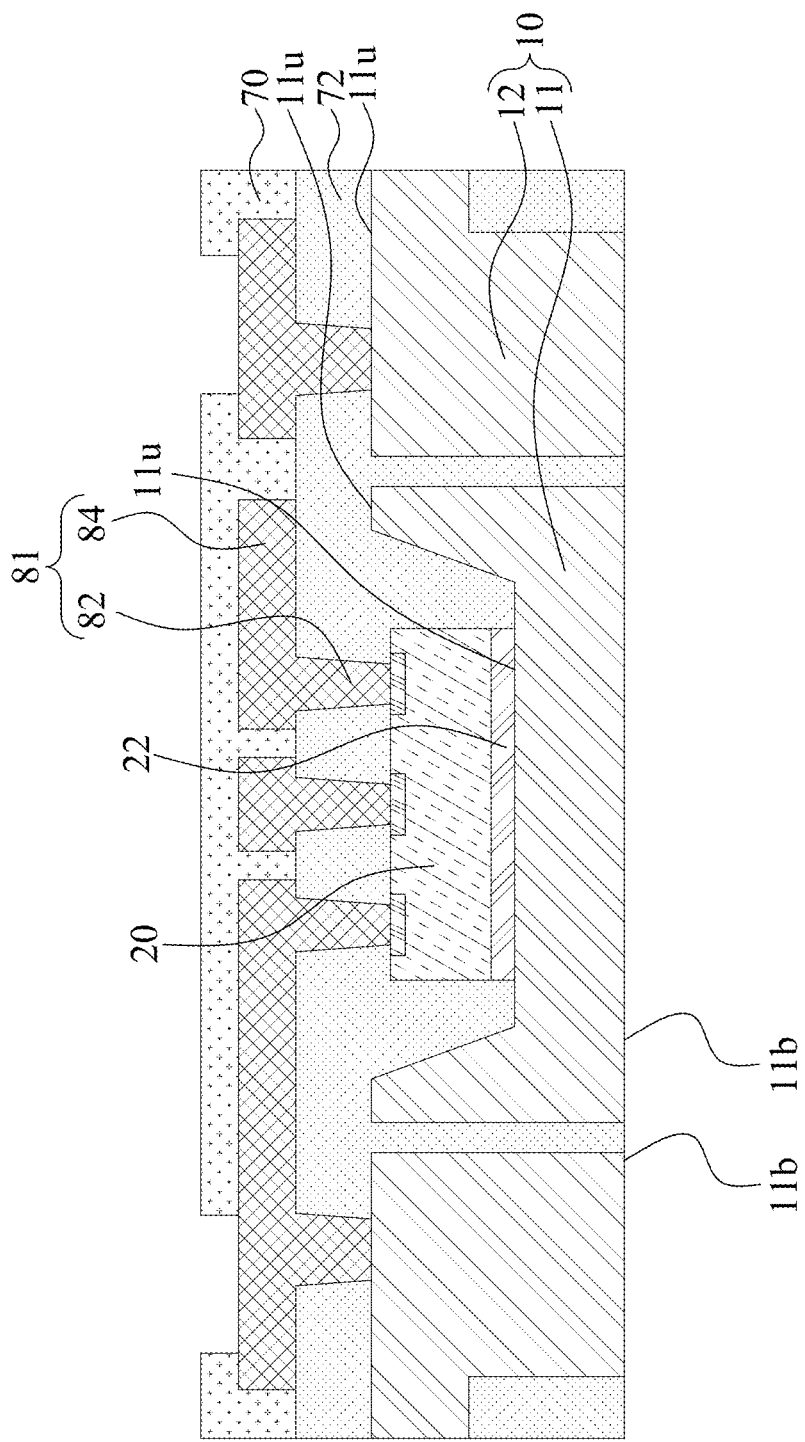

Referring to FIG. 2F, a solder mask layer 70 is patterned over the dielectric layer 72 and the conductive traces 84. The solder mask layer 70 covers the dielectric layer 72 and a portion of the conductive traces 84. The solder mask layer 70 includes some openings to expose a portion of each of the conductive traces 84.

Figure 2G:
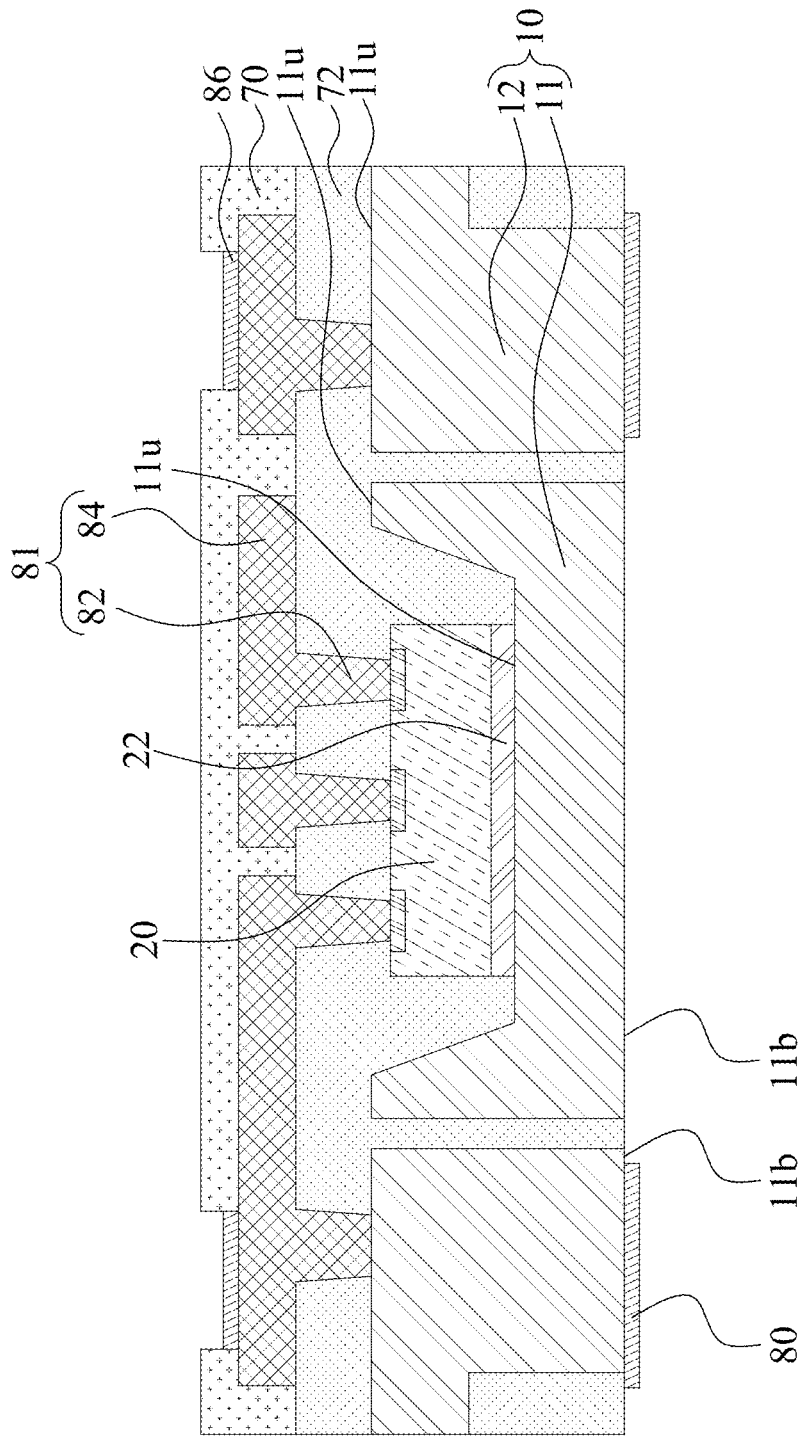

Referring to FIG. 2G, a surface finish layer 80 is formed on the second surface 11b of the lead frame 10 and the exposed portion of the conductive traces 84. The surface finish layer 80 is formed to prevent the copper surfaces from being oxidized prior to subsequent bonding operations. For example, the second surface 11b of the lead frame 10 will be bonded with the passive component, and the exposed portion of the conductive traces 84 will be bonded with solder ball or solder bumps. In some embodiments, the surface finish layer 80 may include any suitable conductive material (such as, for example, nickel (Ni), palladium (Pd), gold (Au), silver (Ag), Cu, and combinations of metals) In some embodiments, the surface finish layer 80 is electroless nickel immersion gold (ENIG). In some embodiments, conductive pads 86 may be formed on the exposed portion of the conductive traces 84. The conductive pads 86 may include, for example, Cu, or other metal, or a metal alloy, or other conductive material.

Figure 2H:
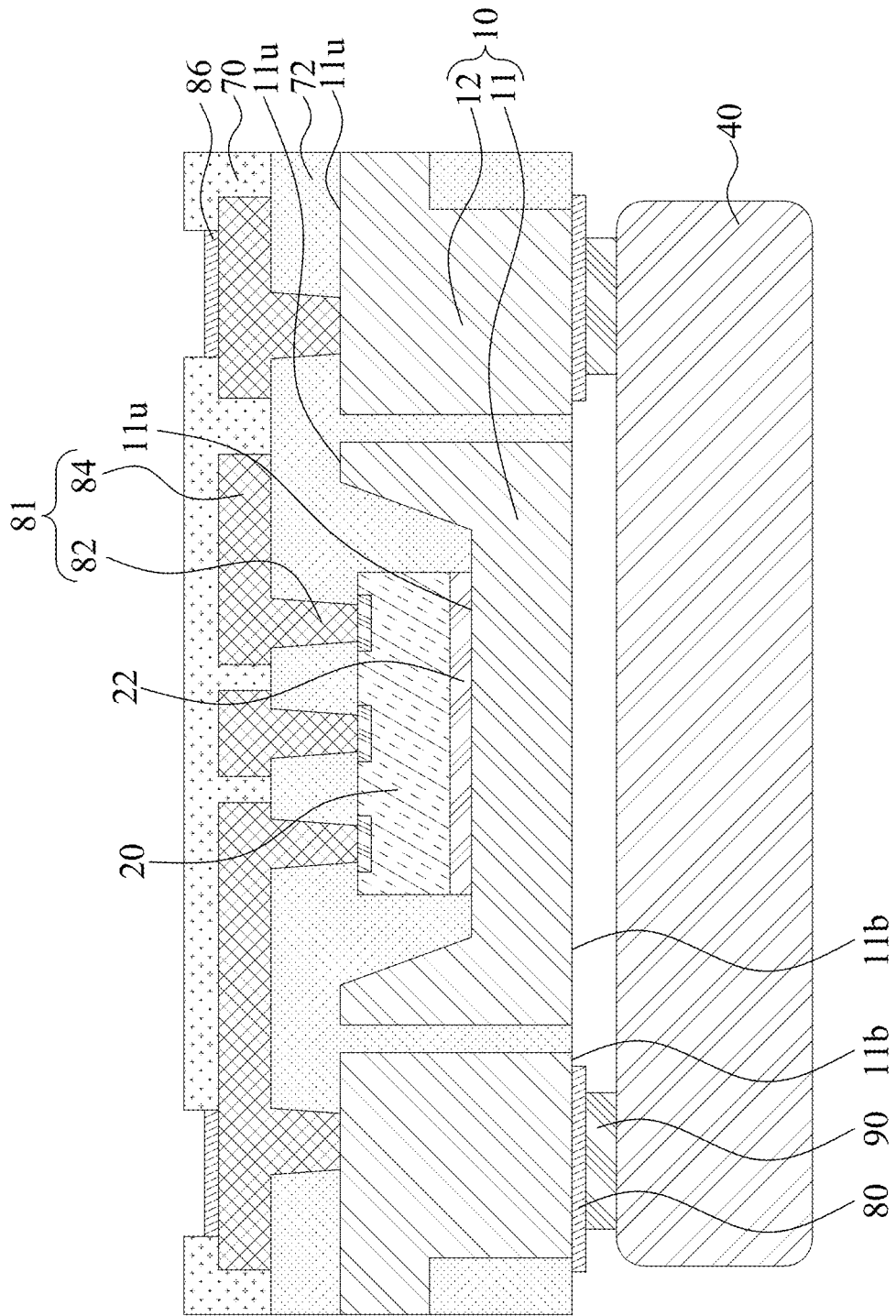

Referring to FIG. 2H, a passive component 40 is disposed on the surface finish layer 80 at the second surface 11b of the lead frame 10 through the external connectors 90. In some embodiments, the external connectors 90 include a solder pattern that matches with the pattern of the second surface 11b of the leads 12.

Figure 3A:
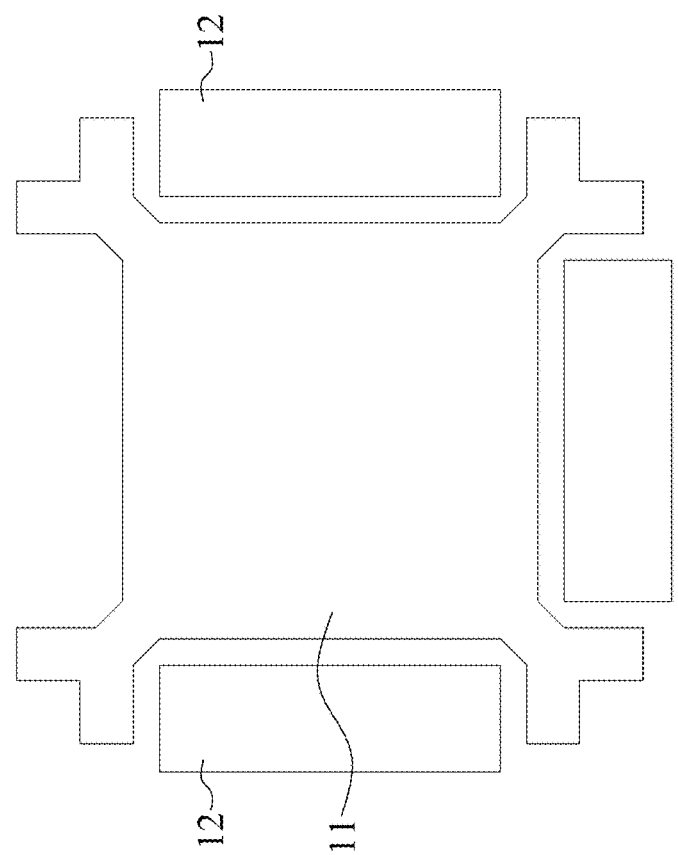
FIG. 3A illustrates a pattern of a lead frame from a surface facing a passive component and a pattern of a passive component from a surface facing the lead frame according to some embodiments of the present disclosure.
Figure 3A:
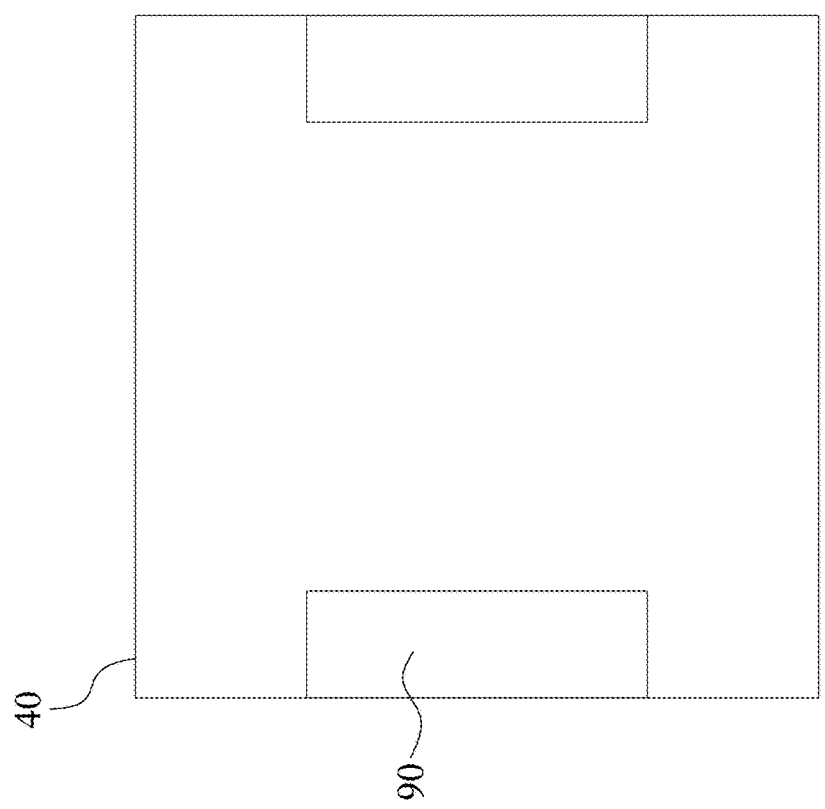

FIG. 3A illustrates a pattern of a lead frame from a surface facing a passive component and a pattern of a passive component from a surface facing the lead frame according to some embodiments of the present disclosure. Referring to FIG. 3A, the lead frame 10 includes a paddle 11 and two elongated leads 12 at opposite sides of the paddle 11. Each of the two leads 12 includes a rectangle shape. The passive component 40 includes two external connectors 90 connected to the I/O of the passive component 40. The two external connectors 90 each includes the rectangle shape corresponding to the each of the two leads 12. The two external connectors 90 are electrically connected to the two lead 12 through the surface finish layer 80 previously formed on the second surface 11b of the lead 12. In some embodiments, the two external connectors 90 can be in direct contact with the two leads 12 without the surface finish layer 80.

Figure 3B:
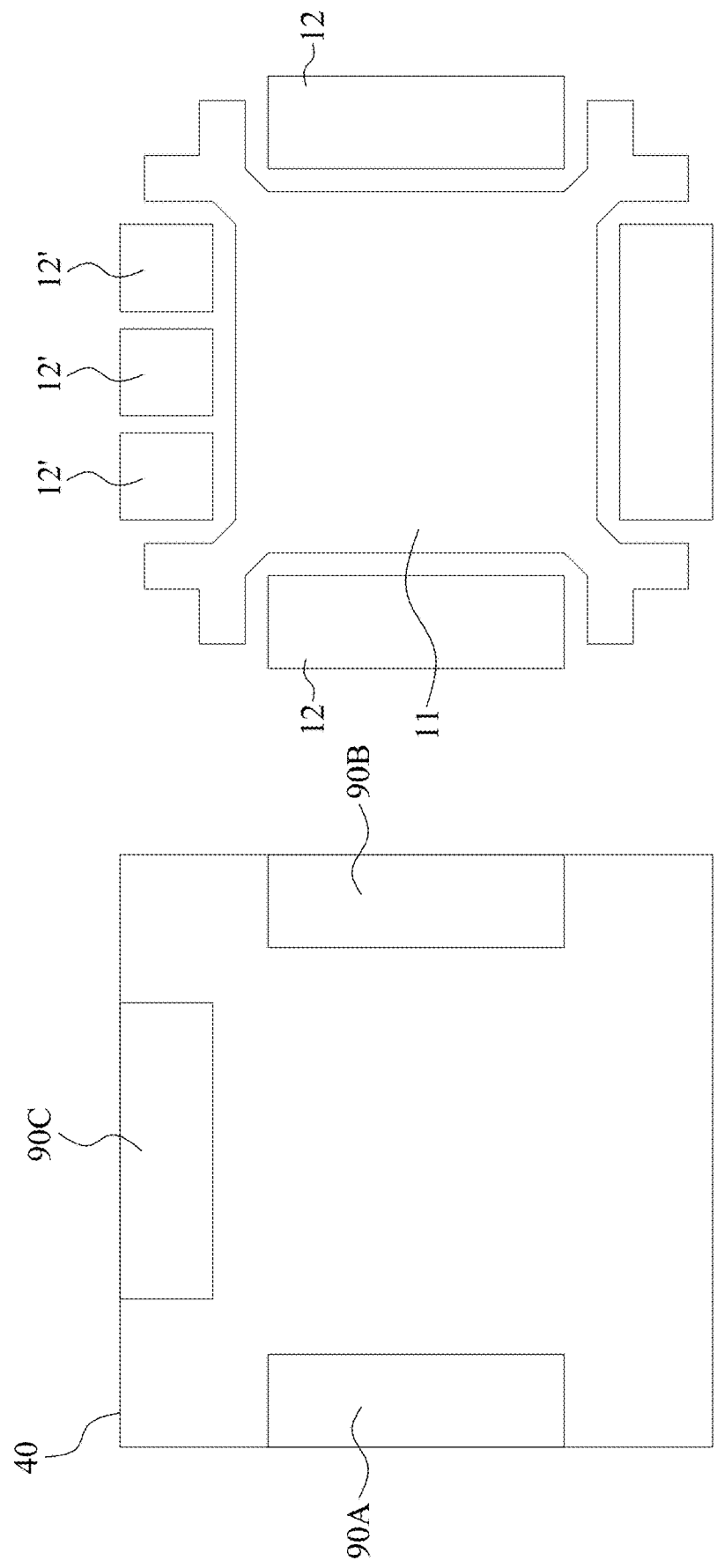
FIG. 3B illustrates a pattern of a lead frame from a surface facing a passive component and a pattern of a passive component from a surface facing the lead frame according to some embodiments of the present disclosure.

FIG. 3B illustrates a pattern of a lead frame from a surface facing a passive component and a pattern of a passive component from a surface facing the lead frame according to some embodiments of the present disclosure. Referring to FIG. 3B, the lead frame 10 includes a paddle 11, two elongated leads 12 at opposite sides of the paddle 11, and a plurality of isolated leads 12' at another side of the paddle 11. Each of the two elongated leads 12 includes a rectangle shape. Each of the plurality of isolated leads 12' include a square shape or another shapes with dimensions substantially uniform in all directions. The passive component 40 includes three external connectors 90A, 90B, 90C, connected to the I/O of the passive component 40. The two external connectors 90A and 90B at the opposite sides of the passive component 40 include rectangular shape corresponding to the each of the two elongated leads 12. The external connectors 90C may also include a rectangular shape covering the plurality of isolated leads 12'. Although the geometrical pattern of the external connector 90C does not match with the geometrical pattern of each of the isolated leads 12', the external connector 90C is bonded to the plurality of isolated leads 12' through the same bonding structure as that in the external connectors 90A, 90B and the elongated leads 12.

The three external connectors 90A, 90B, 90C, are electrically connected to the two elongated leads 12 and the isolated leads 12' through the surface finish layer 80. In some embodiments, the three external connectors 90A, 90B, 90C, are in direct contact to the two elongated leads 12 and the isolated leads 12'.

Figure 3C:
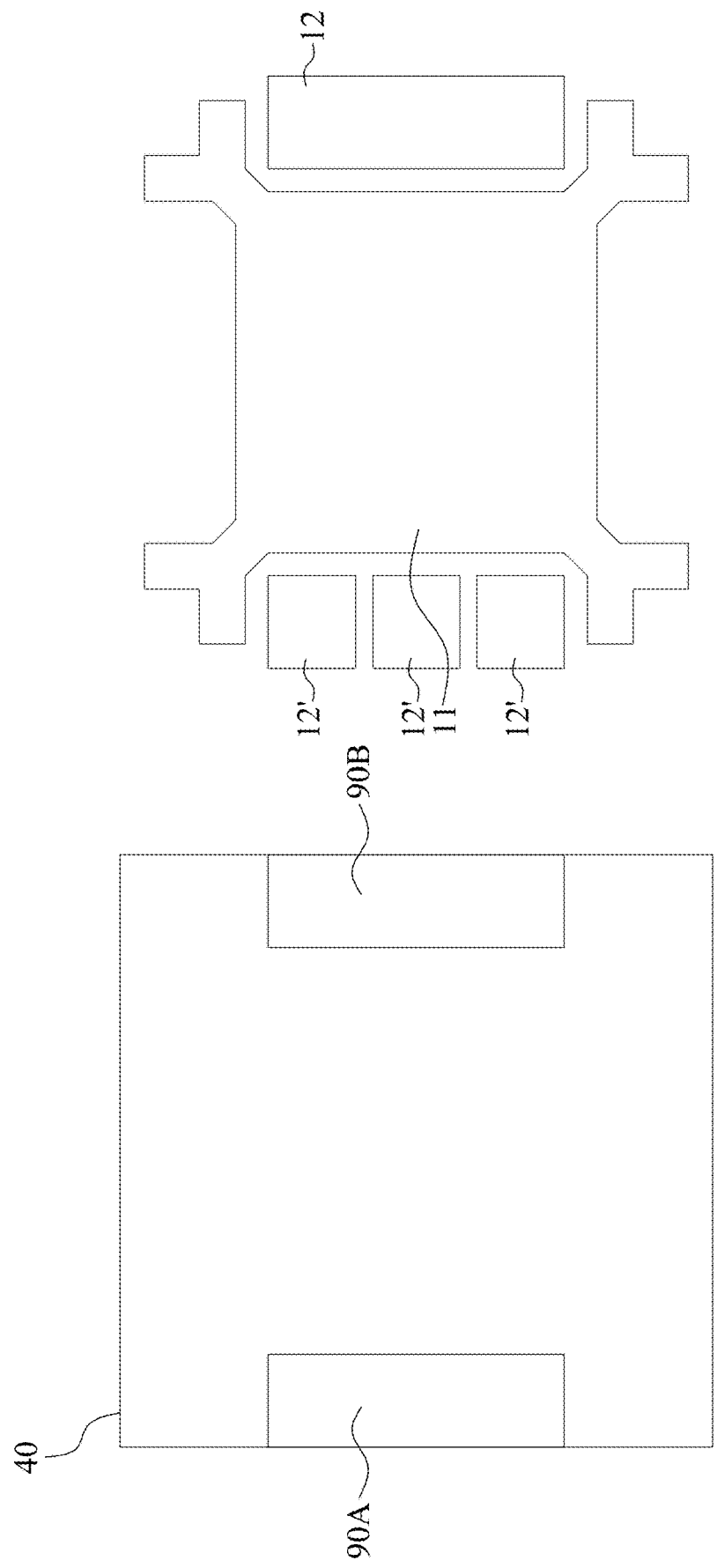
FIG. 3C illustrates a pattern of a lead frame from a surface facing a passive component and a pattern of a passive component from a surface facing the lead frame according to some embodiments of the present disclosure.

Referring to FIG. 3C, the lead frame 10 includes a paddle 11, an elongated lead 12 and a plurality of isolated leads 12'. The elongated lead 12 includes a rectangular shape and the isolated leads 12' include a square shape or another shape with dimensions substantially uniform in all directions. The passive component 40 includes two external connectors 90A and 90B. The external connectors 90B includes rectangular shape corresponding to the elongated lead 12. The external connectors 90A includes rectangular shape covering the plurality of isolated leads 12'. Although the geometrical pattern of the external connector 90B does not match with the geometrical pattern of each of the isolated leads 12', the external connector 90B is bonded to the plurality of isolated leads 12' through the same bonding structure as that in the external connectors 90A and the elongated leads 12.

The external connectors 90A and 90B are electrically connected to the elongated lead 12 and the isolated leads 12' through the surface finish layer 80. In some embodiments, the external connectors 90A and 90B are in direct contact with the elongated lead 12 and the isolated leads 12' without the surface finish layer 80.

FIGS. 4A and 4B illustrates the microstructure with respect to grains of a plating copper and a rolled annealed (RA) copper, respectively, according to some embodiments of the present disclosure. The RA copper possesses an elongated grain shape (or a preferred orientation) as illustrated in FIG. 4B. For example, the grains of RA copper can each define a principal elongation dimension as a result of the rolling and annealing operations, whereas the plated copper, as illustrated in FIG. 4A, may have grains without a defined elongated dimension (or a preferred orientation). In the present disclosure, the external connectors 90 of the passive component 40 are bonded to a lead frame which is made of RA copper.

Figure 5:
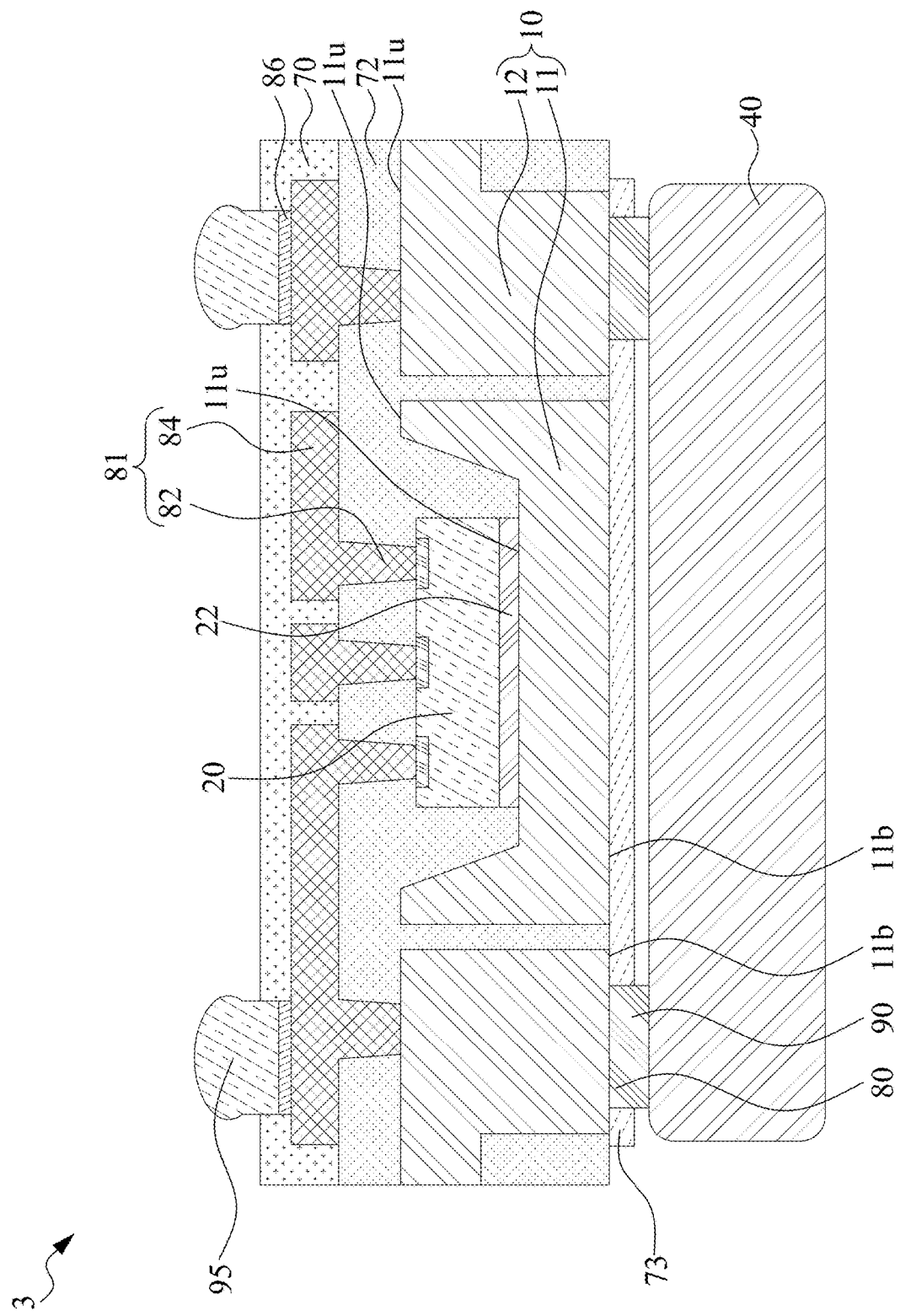
FIG. 5 illustrates a cross-sectional view of a semiconductor package structure according to some embodiments of the present disclosure.

FIG. 5 illustrates a cross-sectional view of a semiconductor package structure 3 according to some embodiments of the present disclosure. The semiconductor device package 3 is similar to the semiconductor device package 1 of FIG. 1A, except that the semiconductor device package 3 replaces the surface finish layer 80 of FIG. 1A and FIG. 1B with an insulation layer 73. The insulation layer 73 is disposed at the second surface 11b of the lead frame 10. The passive component 40 is electrically connected to at least two of the plurality of leads 12 through the external connectors 90 penetrating the insulation layer 73. In some embodiments, a material of the insulation layer 73 may include a polypropylene (PP) resin. However, other suitable materials may be additionally or alternatively used.

Figure 6:
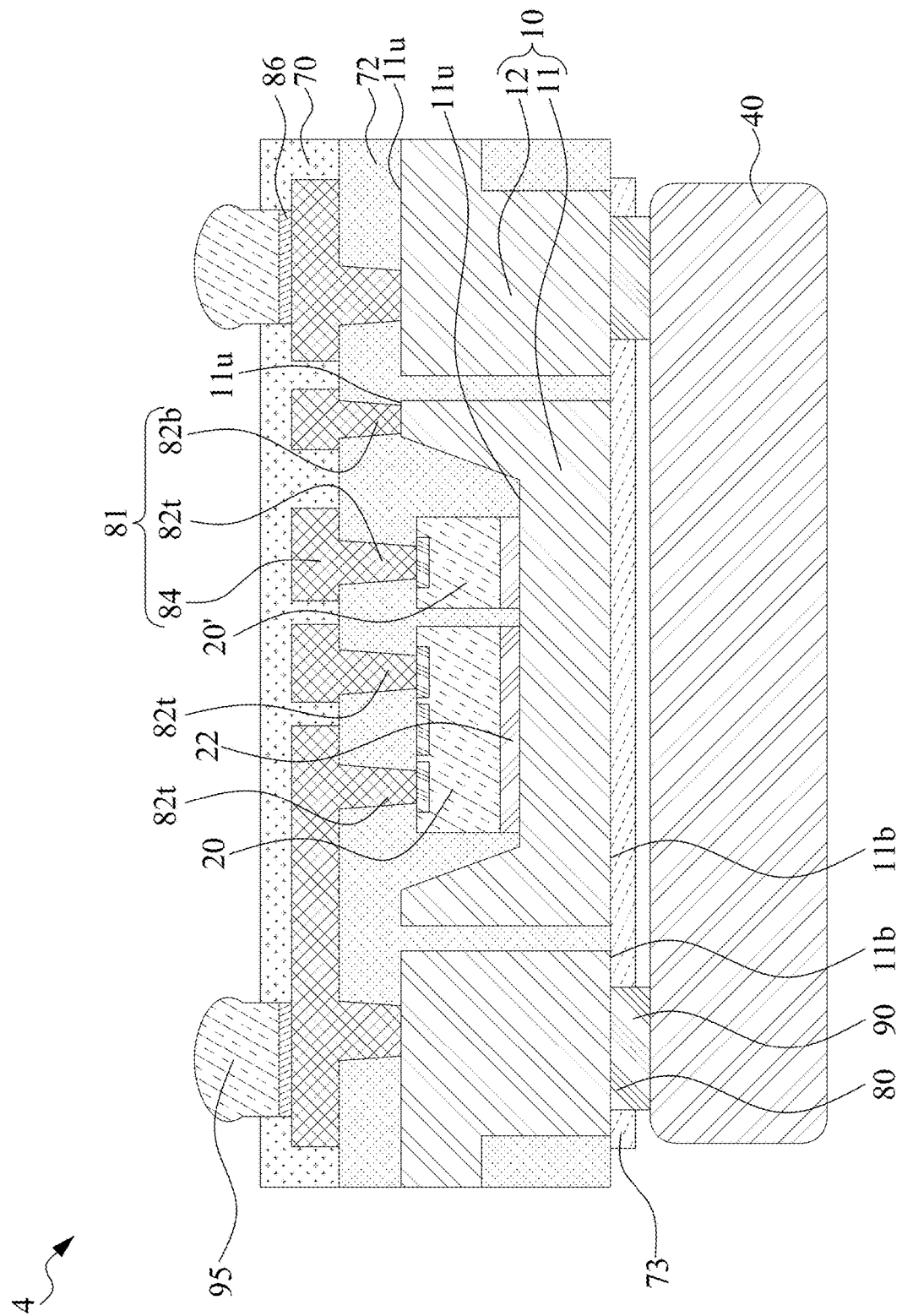
FIG. 6 illustrates a cross-sectional view of a semiconductor package structure according to some embodiments of the present disclosure.

FIG. 6 illustrates a cross-sectional view of a semiconductor package structure 4 according to some embodiments of the present disclosure. The semiconductor device package 4 is similar to the semiconductor device package 3 of FIG. 5, except that more than one die is disposed in the embedded lead frame 10. For example, a die 20 and a die 20' are disposed in the cavity of the paddle 11. In some embodiments, the die 20 can be a power management IC (PMIC) having either a vertical current flow or a lateral current flow. The die 20' can be a control IC having a lateral current flow. For the PMIC with a vertical current flow, the adhesive layer 22 may include conductive gel so that the current can flow from the conductive via 82t of the RDL 81 toward the paddle 11, traversing the vertical dimension of the die 20. In some embodiments, a conductive via 82b connects the first surface 11u of the paddle 11, serving as a back terminal for the PMIC with vertical current flow. For the PMIC with a lateral current flow, the adhesive layer 22 may include non-conductive adhesive material. The current can flow from one of the conductive vias 82t toward another conductive vias 82t of the RDL 81, traversing the lateral dimension of the die 20.

Figure 7:
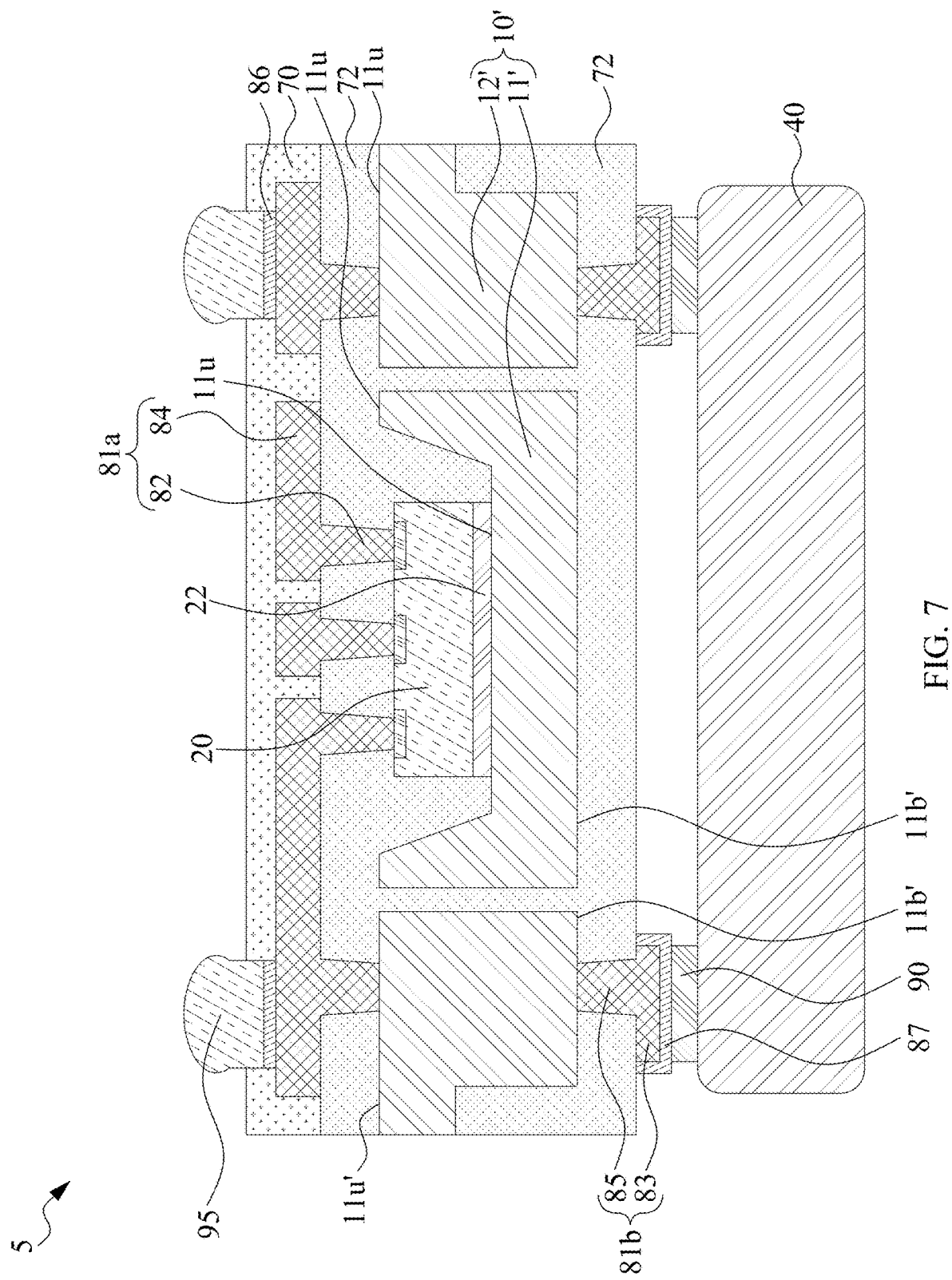
FIG. 7 illustrates a cross-sectional view of a semiconductor package structure according to a comparative embodiment of the present disclosure.

FIG. 7 illustrates a cross-sectional view of a semiconductor package structure 5 according to a comparative embodiment of the present disclosure. The semiconductor package structure 5 includes a lead frame 10', a die 20, a first RDL 81a proximal to the first surface 11u' of the lead frame 10, a second RDL 81b proximal to the second surface 11b' of the lead frame 10, and a passive component 40 connected to the lead frame 10 through the second surface 11b'. The conventional lead frame 10' has a plurality of leads 12' surrounding the paddle 11'. The geometrical shape of the leads 12' may appear to be isolated patterns similar to the isolated leads 12' illustrated in FIG. 3B, and thus does not match with the geometrical pattern of the external connectors 90 of the passive component 40. The second RDL 81b is often adopted to form conductive vias 85 surrounded by the dielectric layer 72 and conductive traces 83 over the dielectric layer 72, wherein a geometrical shape of the conductive traces 83 can better match with the geometrical shape of the external connectors 90. The dielectric layer 72 surrounding the second RDL 81b is disposed between the passive component 40 and the die 20, rendering a path prone to accumulate heat, especially when the die 20 is a high power chip. The fabrication of the second RDL 81b at the second surface 11b' of the lead frame 10' increases the production cost and hinder the heat dissipation, therefore, in the embodiments of the present disclosure, the second RDL 81b is no longer adopted, instead, the geometrical pattern of the leads are altered to match with the geometrical pattern of the external connectors of the passive device. The embodiments of the present disclosure provide semiconductor packages structure with better heat dissipation and lower production cost.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a lead frame comprising a first top surface and a first bottom surface opposite to the first top surface, the lead frame comprising a die paddle and a lead separated from the die paddle;
   a die disposed over the lead frame;
   a dielectric layer encapsulating the lead frame, wherein the dielectric layer laterally covers the lead frame and the die, wherein the first bottom surface of the lead frame is exposed from a second bottom surface of the dielectric layer;
   a surface finish layer in direct contact with the first bottom surface of the lead frame and the second bottom surface of the dielectric layer; and
   a passive component disposed under the first bottom surface of the lead frame and vertically overlapped with the die paddle,
   wherein an active surface of the die faces away from the first top surface;
   a redistribution layer (RDL) disposed over a second top surface of the dielectric layer opposite to the second bottom surface of the dielectric layer and including a first via extended into the dielectric layer, and wherein the first via tapers toward the lead frame.

2. The semiconductor package structure according to claim 1, wherein an elevation level of a first interface between the first via and the active surface of the die is lower than an elevation level of the first top surface.

3. The semiconductor package structure according to claim 2, wherein the RDL further comprises a second via disposed over the lead and extended into the dielectric layer, wherein a width of a second interface is between the lead and the second via and is greater than a width of the first interface.

4. The semiconductor package structure according to claim 1, wherein the passive element is disposed under the die paddle of the lead frame and separated from the die paddle.

5. The semiconductor package structure according to claim 4, wherein the die paddle and the passive element define a cavity between the die paddle and the passive element.

6. The semiconductor package structure according to claim 5, wherein the cavity is extended to a region directly under a gap between the die paddle and the lead.

7. The semiconductor package structure according to claim 5, wherein, in a cross sectional view, an entire bottom surface of the die paddle is exposed from the second bottom surface of the dielectric layer.

8. A semiconductor package structure, comprising:
   a lead frame comprising a first top surface and a first bottom surface opposite to the first top surface, the lead frame comprising a die paddle and a lead separated from the die paddle;
   a die disposed over the lead frame;
   a dielectric layer encapsulating the lead frame, wherein the dielectric layer laterally covers the lead frame and the die, wherein the first bottom surface of the lead frame is exposed from a second bottom surface of the dielectric layer;
   a surface finish layer in direct contact with the first bottom surface of the lead frame and the second bottom surface of the dielectric layer; and
   a passive component disposed under the first bottom surface of the lead frame and vertically overlapped with the die paddle;
   wherein the passive element is disposed under the die paddle of the lead frame and separated from the die paddle;
   wherein the die paddle and the passive element define a cavity between the die paddle and the passive element;
   wherein the surface finish layer is electrically connected to the passive element, and the surface finish layer is laterally overlapped with the cavity.

9. The semiconductor package structure according to claim 8, wherein the passive component is connected to the surface finish layer through a connector, and the connector is laterally overlapped with the cavity.

10. A semiconductor package structure, comprising:
    a lead frame comprising a first top surface and a first bottom surface opposite to the first top surface, the lead frame comprising a die paddle and a lead separated from the die paddle;
    a dielectric layer encapsulating the lead frame, wherein the dielectric layer laterally covers the lead frame, wherein the first bottom surface of the lead frame is exposed from a second bottom surface of the dielectric layer;
    a surface finish layer in direct contact with the first bottom surface of the lead frame and the second bottom surface of the dielectric layer; and
    a passive component disposed under the first bottom surface of the lead frame, and wherein the die paddle and the passive component define a cavity between the die paddle and the passive element;
    wherein a bottom surface of the die paddle is exposed from the second bottom surface of the dielectric layer, and the second bottom surface of the dielectric layer is aligned with the first bottom surface of the lead frame;

wherein the dielectric layer laterally covers a lateral surface of the lead, wherein the surface finish layer is disposed under an interface between the dielectric layer and the lead.

11. The semiconductor package structure according to claim 10, wherein, in a cross-sectional view, a first side end of the surface finish layer protrudes beyond a vertical projection of the lead, and a second side end of the surface finish layer does not protrudes beyond the vertically projection of the lead.

12. The semiconductor package structure according to claim 10, further comprising a redistribution layer (RDL) including a trace disposed over the first top surface of the lead frame, and wherein a distance between the trace and the first top surface of the lead frame is greater than a height of the cavity.

13. The semiconductor package structure according to claim 12, further comprising a second lead adjacent to the lead and separated from the die paddle and the lead, wherein in a cross-sectional view, the RDL comprises a first portion directly connected to the lead, and a second portion spaced apart the first portion and not connected to the second lead.

14. The semiconductor package structure according to claim 10, wherein the cavity includes an upper portion and a lower portion, wherein the lower portion is closer to the passive component than the upper portion is, and a width of the lower portion is greater than a width of the upper portion.

15. The semiconductor package structure according to claim 14, further comprising a connector disposed between the passive element and the first bottom surface of the lead frame, wherein the connector and the surface finish layer collectively define a height of the cavity.

16. The semiconductor package structure according to claim 10, wherein the passive element is electrically connected to the lead and a second lead through a first connector and a second connector, respectively.

* * * * *